(12) United States Patent
Lin et al.

(10) Patent No.: US 12,111,113 B2
(45) Date of Patent: Oct. 8, 2024

(54) HEAT TRANSFER COMPONENT REINFORCEMENT STRUCTURE

(71) Applicant: ASIA VITAL COMPONENTS CO., LTD., New Taipei (TW)

(72) Inventors: Sheng-Huang Lin, New Taipei (TW); Yuan-Yi Lin, New Taipei (TW)

(73) Assignee: ASIA VITAL COMPONENTS CO., LTD., New Taipei (TW)

( * ) Notice: Subject to any disclaimer, the term of this patent is extended or adjusted under 35 U.S.C. 154(b) by 105 days.

(21) Appl. No.: 16/666,426

(22) Filed: Oct. 29, 2019

(65) Prior Publication Data
US 2021/0123687 A1    Apr. 29, 2021

(51) Int. Cl.
*F28D 15/04*    (2006.01)
*H05K 7/20*    (2006.01)

(52) U.S. Cl.
CPC ......... *F28D 15/04* (2013.01); *H05K 7/20218* (2013.01); *H05K 7/20336* (2013.01); *H05K 7/2039* (2013.01)

(58) Field of Classification Search
CPC .......... F28D 15/04; F28D 15/0275; F28D 2021/0029; H05K 7/20336; H05K 7/2039; H05K 7/20218; H05K 7/20409; H05K 7/20418; F28F 2225/00; F28F 2225/02; F28F 2275/14; F28F 2275/146; F28F 2275/085
See application file for complete search history.

(56) References Cited

U.S. PATENT DOCUMENTS

| | | | | |
|---|---|---|---|---|
| 3,894,580 | A * | 7/1975 | Chartet | F28F 9/001 165/67 |
| 4,465,126 | A * | 8/1984 | Winterer | F28D 1/05333 165/134.1 |
| 5,982,620 | A * | 11/1999 | Lin | G06F 1/20 174/16.3 |
| 6,082,440 | A * | 7/2000 | Clemens | H01L 23/4093 165/185 |

(Continued)

FOREIGN PATENT DOCUMENTS

| | | | |
|---|---|---|---|
| CN | 2434719 | Y | 6/2001 |
| CN | 2481640 | Y | 3/2002 |

(Continued)

OTHER PUBLICATIONS

Search Report dated May 18, 2020 issued by Taiwan Intellectual Property Office for counterpart application No. 108134263.
(Continued)

*Primary Examiner* — Travis Ruby
(74) *Attorney, Agent, or Firm* — Bradley J. Thorson; DeWitt LLP

(57) ABSTRACT

A heat transfer component reinforcement structure includes a main body. The main body has a pair of first lateral sides and a pair of second lateral sides and a reinforcement member. The reinforcement member is correspondingly externally connected with the main body in at least one manner selected from the group consisting of that the reinforcement members are engaged, latched and connected with the first lateral sides and the second lateral sides of the main body and the reinforcement members are engaged, latched and connected with the junctions between the first and second lateral sides in four corners.

2 Claims, 6 Drawing Sheets

(56) References Cited

U.S. PATENT DOCUMENTS

| | | | | |
|---|---|---|---|---|
| 6,173,765 | B1* | 1/2001 | Uchikawa | F28F 9/02 165/173 |
| 6,724,632 | B2* | 4/2004 | Lee | H01L 23/4093 165/185 |
| 6,845,006 | B2* | 1/2005 | Kobayashi | G11B 33/1426 360/99.18 |
| 6,957,966 | B2* | 10/2005 | Martin | H05K 7/1431 361/719 |
| 6,992,893 | B2* | 1/2006 | Miyamura | H01L 23/4093 165/80.3 |
| 7,554,809 | B2* | 6/2009 | Chang | H01L 23/4006 165/185 |
| 9,668,335 | B1* | 5/2017 | Canseco | F28F 3/02 |
| 10,736,235 | B2* | 8/2020 | Yu | G06F 1/20 |
| 2004/0169956 | A1* | 9/2004 | Oba | H05K 7/20418 |
| 2005/0195565 | A1* | 9/2005 | Bright | H04B 1/036 361/688 |
| 2007/0151705 | A1* | 7/2007 | Kwan | H01L 23/4093 165/80.2 |
| 2008/0291654 | A1* | 11/2008 | Liao | H05K 9/002 361/818 |
| 2009/0116195 | A1* | 5/2009 | Yang | H01L 23/3675 361/709 |
| 2010/0038064 | A1* | 2/2010 | Liu | F28F 1/32 165/181 |
| 2011/0032714 | A1 | 2/2011 | Chang | |
| 2011/0315366 | A1* | 12/2011 | Chen | B21D 53/085 165/185 |
| 2012/0300403 | A1* | 11/2012 | Scholeno | H05K 7/2049 361/702 |
| 2015/0184948 | A1* | 7/2015 | Lin | F28D 15/0275 165/104.21 |
| 2016/0049705 | A1* | 2/2016 | Mahe | F28F 3/12 429/120 |
| 2017/0105316 | A1* | 4/2017 | Lin | H01L 23/4093 |
| 2017/0252878 | A1* | 9/2017 | Lin | B21K 25/00 |
| 2018/0177072 | A1* | 6/2018 | Pando Rodriguez | H01L 23/373 |
| 2019/0003775 | A1* | 1/2019 | Lin | H05K 7/209 |
| 2019/0394903 | A1* | 12/2019 | Chang | B21D 39/032 |
| 2021/0123686 | A1* | 4/2021 | Lin | F28D 15/04 |

FOREIGN PATENT DOCUMENTS

| | | |
|---|---|---|
| CN | 2490791 Y | 5/2002 |
| CN | 201222842 Y | 4/2009 |
| CN | 201674751 U | 12/2010 |
| CN | 201707636 U | 1/2011 |
| CN | 103209569 A | 7/2013 |
| CN | 103700636 A | 4/2014 |
| CN | 104105380 A | 10/2014 |
| CN | 204392738 U | 6/2015 |
| CN | 105636403 A | 6/2016 |
| CN | 106061210 A | 10/2016 |
| CN | 205983368 U | 2/2017 |
| CN | 206272929 U | 6/2017 |
| CN | 206332208 U | 7/2017 |
| CN | 207178026 U | 4/2018 |
| CN | 207257362 U | 4/2018 |
| CN | 109906017 A | 6/2019 |
| TW | M287461 U | 2/2006 |
| TW | M505790 | 7/2015 |
| TW | M570587 | 11/2018 |
| TW | M588234 | 12/2019 |

OTHER PUBLICATIONS

Search Report dated Nov. 12, 2020 issued by Taiwan Intellectual Property Office for counterpart application No. 108134263.

Search Report dated Apr. 13, 2020 issued by China National Intellectual Property Administration for counterpart application No. 2019109015310.

Search Report dated Nov. 17, 2020 issued by China National Intellectual Property Administration for counterpart application No. 2019109015310.

Search Report dated Feb. 18, 2021 issued by China National Intellectual Property Administration for counterpart application No. 2019109015310.

* cited by examiner

HEAT TRANSFER COMPONENT REINFORCEMENT STRUCTURE

BACKGROUND OF THE INVENTION

1. Field of the Invention

The present invention relates generally to a heat transfer component reinforcement structure, and more particularly to a heat transfer component reinforcement structure, which is connected with the heat transfer component to enhance the structural strength of the heat transfer component.

2. Description of the Related Art

A common electronic apparatus has multiple electronic components therein, such as central processing unit. In operation, the electronic components will generate a great amount of heat. In case the heat generated by the electronic components is not dissipated in time, the temperature of the working environment of the electronic components will rise to seriously affect the normal operation of the electronic components. Therefore, in general, a heat dissipation member such as heat sink or radiating fins or a heat conduction unit such as heat conduction base seat or vapor chamber or flat-plate heat pipe is securely disposed on the surface of the heat generation electronic components to achieve heat dissipation and heat transfer effect.

Generally, the heat dissipation member or the heat conduction unit is located in such a manner that the heat dissipation member or the heat conduction unit is directly latched on a proper section of the periphery of the electronic member (CPU) on the motherboard by means of a leaf spring or a latching device. Accordingly, the heat dissipation member or the heat conduction unit will relatively apply a pressing force to the electronic member so that the heat dissipation member can fully attach to the surface of the heat generation electronic component.

However, in structural design, the motherboard cannot bear great force. Therefore, according to the above securing means, the weight of the heat dissipation member or the heat conduction unit will improperly force the motherboard to cause damage of the motherboard. In order to avoid this, a conventional securing structure for the heat dissipation member or the heat conduction unit is provided. A board body is positioned under the motherboard and multiple fixing members are passed through the perforations of the motherboard to secure the board body to the heat dissipation member or the heat conduction unit on the motherboard. Accordingly, the motherboard is protected from being damaged due to improper application force. However, the board body can simply increase the strength of the motherboard. When a greater downward pressing force is applied to the heat dissipation member or the heat conduction unit, the heat dissipation member will be bent or broken or damaged.

It is therefore tried by the applicant to provide a heat transfer member reinforcement structure to increase the structural strength of the heat dissipation member or the heat conduction base seat.

SUMMARY OF THE INVENTION

It is therefore a primary object of the present invention to provide a heat transfer component reinforcement structure capable of increasing the strength of the heat transfer component.

To achieve the above and other objects, the heat transfer component reinforcement structure of the present invention includes a main body.

The main body has a pair of first lateral sides and a pair of second lateral sides and a reinforcement member. The reinforcement member is correspondingly externally connected with the main body (in adaptation to the main body) in at least one manner selected from the group consisting of that the reinforcement members are engaged, latched and connected with the first lateral sides and the second lateral sides and the reinforcement members are engaged, latched and connected with the junctions between the first and second lateral sides in four corners and. The reinforcement member is connected with the main body to enhance the structural strength of the main body.

The heat transfer component reinforcement structure is able to enhance the structural strength of the heat transfer component. Therefore, when secured, the heat transfer component is able to bear greater downward or upward pressure or tension without deforming or damaging.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
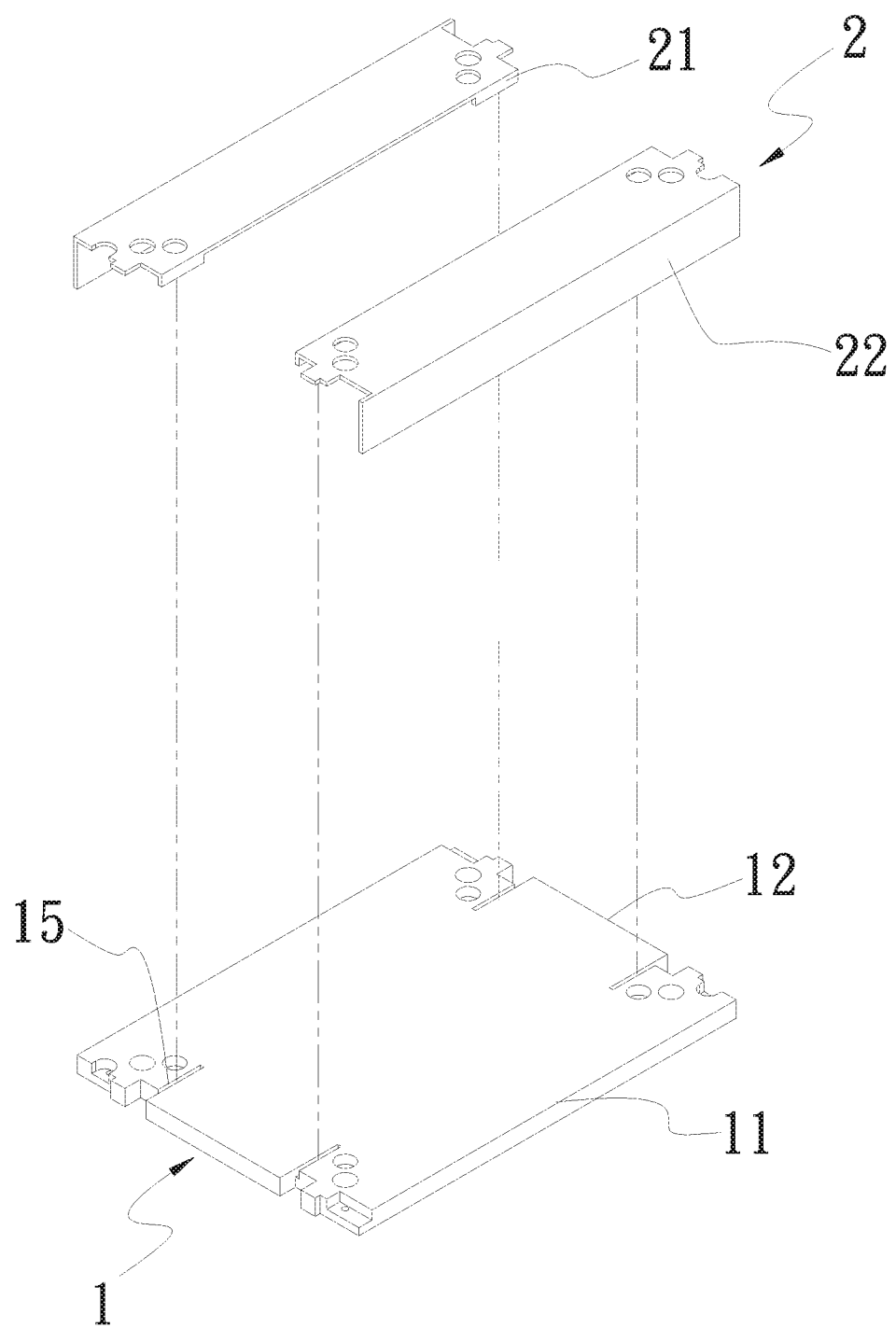
FIG. 1 is a perspective exploded view of a first embodiment of the heat transfer component reinforcement structure of the present invention.
Figure 2:
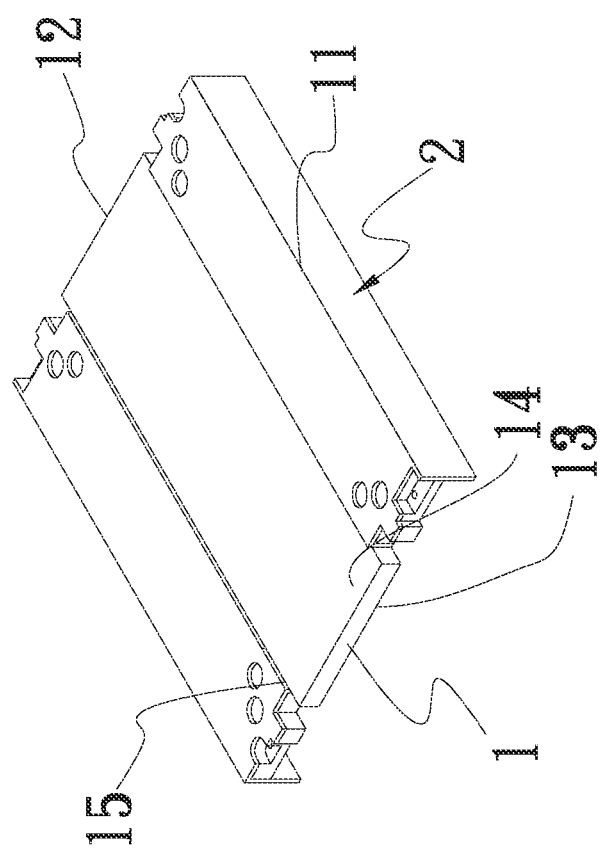
FIG. 2 is a perspective assembled view of the first embodiment of the heat transfer component reinforcement structure of the present invention.

Please refer to FIGS. 1 and 2. FIG. 1 is a perspective exploded view of a first embodiment of the heat transfer component reinforcement structure of the present invention. FIG. 2 is a perspective assembled view of the first embodiment of the heat transfer component reinforcement structure of the present invention. As shown in the drawings, the heat transfer component reinforcement structure of the present invention includes a main body 1.

The main body 1 has a pair of first lateral sides 11 and a pair of second lateral sides 12 and a reinforcement member 2. The reinforcement member 2 is correspondingly externally connected with the main body 1 (in adaptation to the main body 1) in at least one manner selected from the group consisting of that the reinforcement members 2 are engaged, latched and connected with the first lateral sides 11 and the second lateral sides 12, the reinforcement members 2 are engaged, latched and connected with the junctions between the first and second lateral sides 11, 12 in four corners and the reinforcement members 2 extend from the four corners and intersect each other.

The main body 1 and the reinforcement member 2 are made of metal or nonmetal material. The metal material is selected from a group consisting of gold, silver, copper, aluminum, iron, stainless steel, titanium, aluminum alloy, copper alloy, titanium alloy and alloy. The nonmetal material is selected from a group consisting of ceramic, plastic and stone material. The main body 1 and the reinforcement member 2 can be selectively made of the same material or different materials.

The reinforcement member 2 has a hook section 21 and a reinforcement main body 22. In this embodiment, the hook sections 21 are selectively disposed at two ends of the reinforcement main body 22 and normal to the reinforcement main body 22. Certainly, the hook sections 21 can be disposed in any position of the reinforcement main body 22 as necessary to contain an angle (from 0~180 degrees) with the reinforcement main body 22. The main body 1 has a first side 13 and a second side 14. The main body 1 is formed with an engagement split 15 corresponding to the hook section 21 in communication with two sides of the first and second sides 13, 14 of the main body 1. The reinforcement main body 22 is selectively attached to the first side 13 or the second side 14 of the main body 1. In this embodiment, the reinforcement main body 22 is, but not limited to, attached to the second 14 of the main body 1 for illustration purposes. The hook section 21 is correspondingly inserted and engaged in the engagement split 15 of the main body 1.

Figure 3:
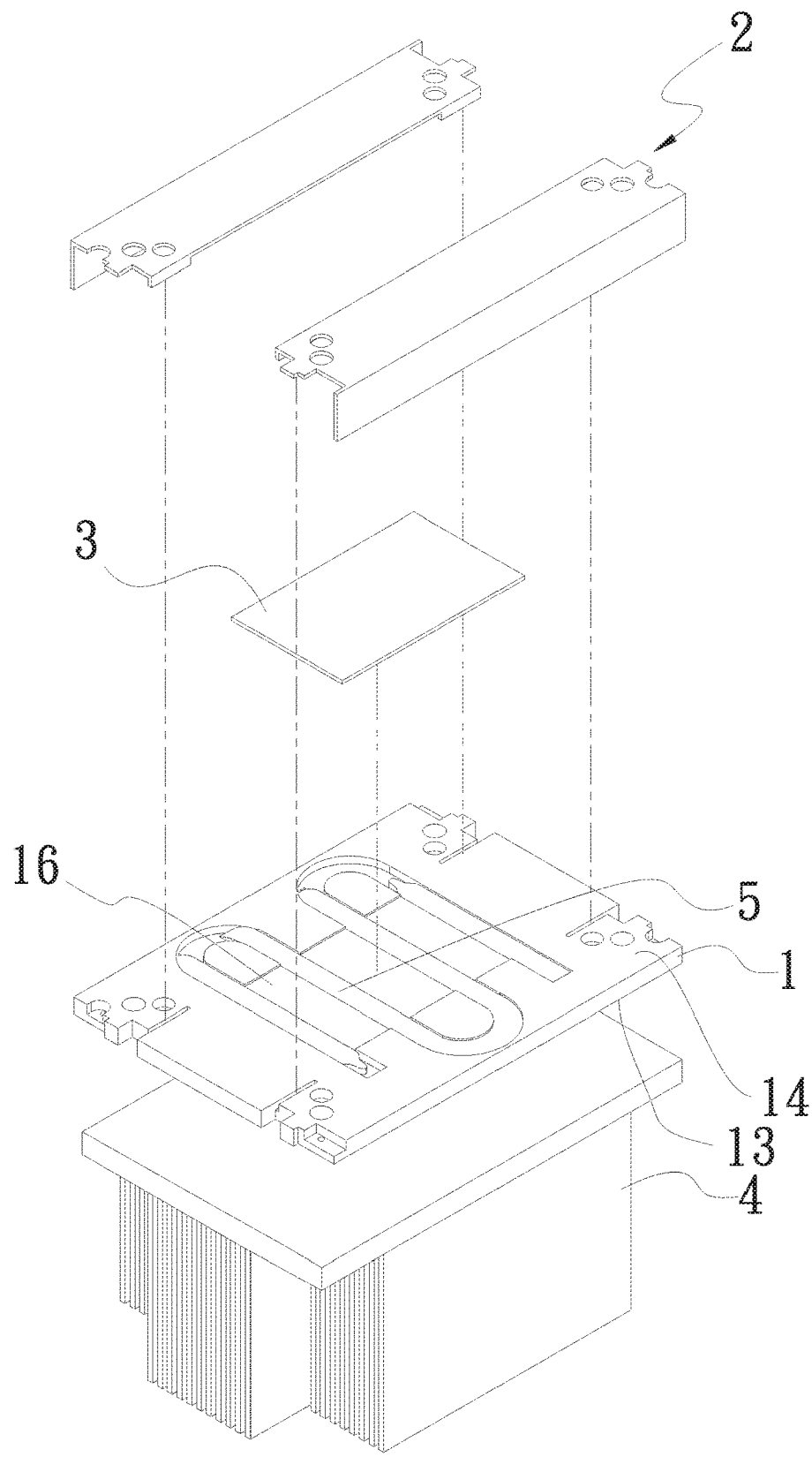
FIG. 3 is a perspective exploded view of a second embodiment of the heat transfer component reinforcement structure of the present invention.

Please now refer to FIG. 3, which is a perspective exploded view of a second embodiment of the heat transfer component reinforcement structure of the present invention. The second embodiment is partially identical to the first embodiment in structure and thus will not be redundantly described hereinafter. The second embodiment is different from the first embodiment in that the main body 1 is a heat conduction base seat. The main body 1 has a first side 13 and a second side 14. A center of the main body 1 is formed with a sink 16. A heat conduction block 3 is inlaid in the sink 16. The heat conduction block 3 is made of copper, aluminum, stainless steel or ceramic material. The first side 13 of the main body 1 is mated with a heat dissipation unit 4. The heat dissipation unit 4 is a heat sink or a radiating fin assembly. Multiple heat pipes 5 are connected with the heat conduction block 3 and the main body 1.

Figure 4:
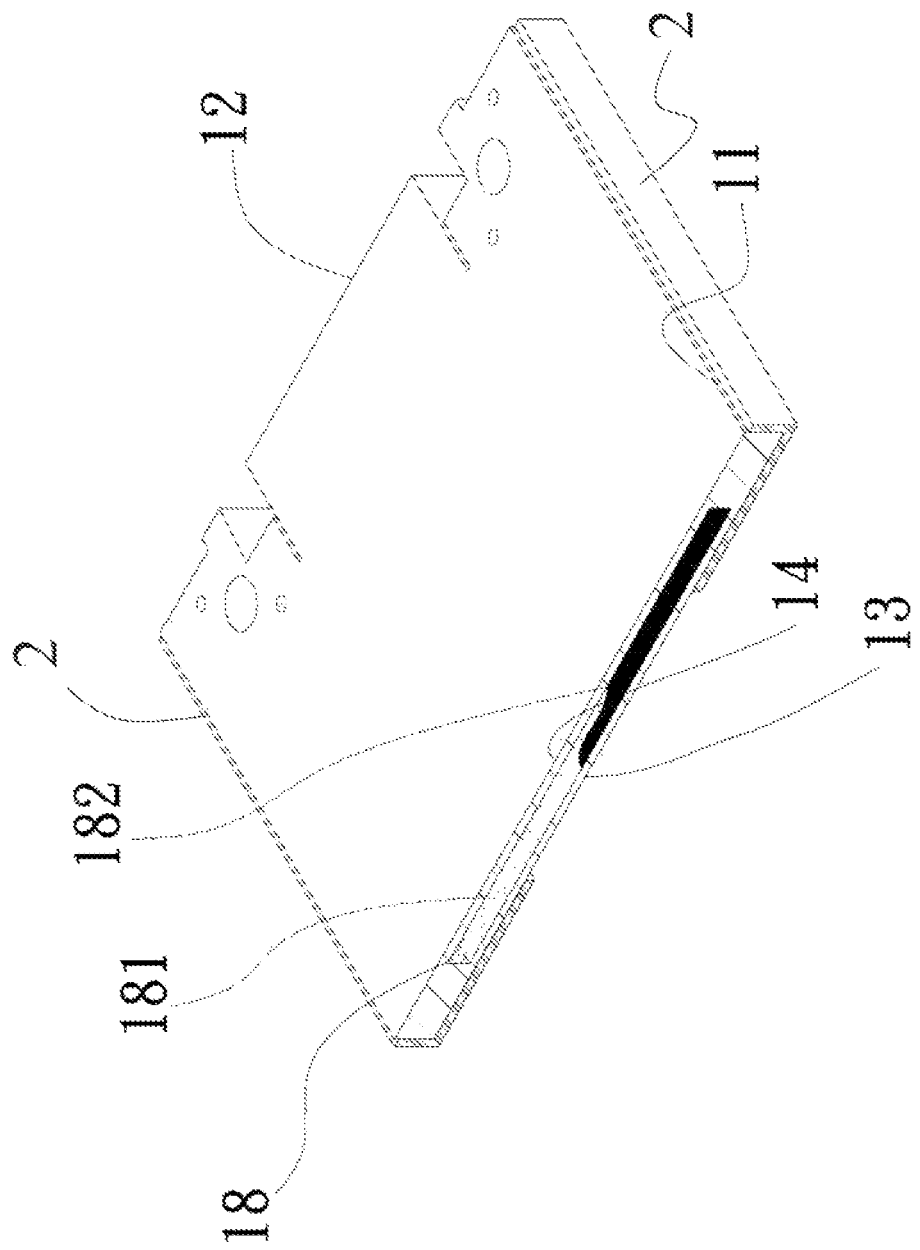
FIG. 4 is a perspective sectional view of a third embodiment of the heat transfer component reinforcement structure of the present invention.

Please now refer to FIG. 4, which is a perspective sectional view of a third embodiment of the heat transfer component reinforcement structure of the present invention. Also referring to FIGS. 1, 2 and 3, the third embodiment is partially identical to the first embodiment in structure and thus will not be redundantly described hereinafter. The third embodiment is different from the first embodiment in that the main body 1 has a first side 13 and a second side 14. An airtight chamber 18 is formed between the first and second sides 13, 14 of the main body 1. A capillary structure 181 is disposed in the airtight chamber 18 and a working liquid 182 is contained in the airtight chamber 18. The reinforcement member 2 is selectively correspondingly disposed on the first and second lateral sides 11, 12 or the first and second sides 13, 14.

Figure 5:
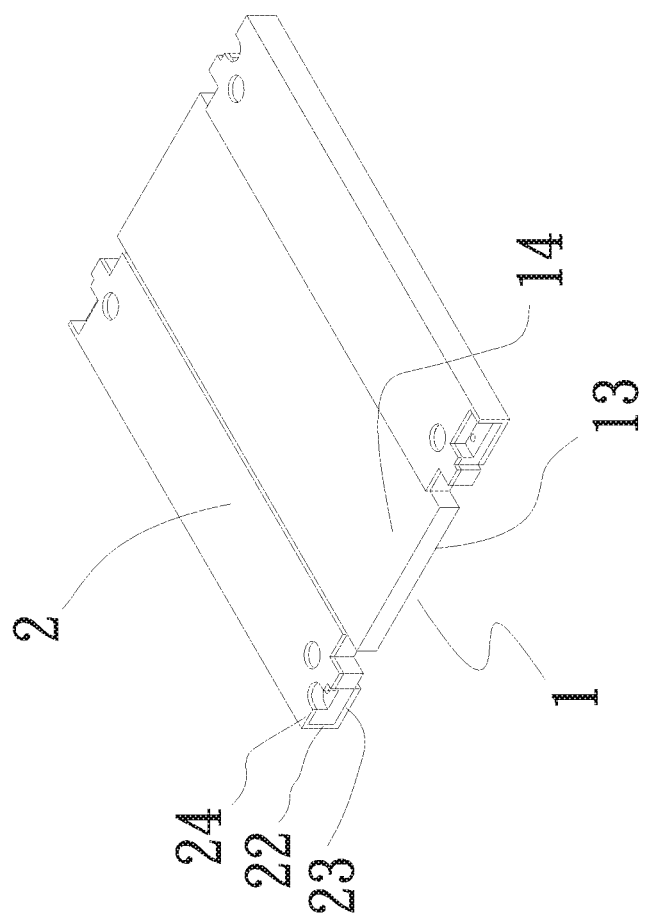
FIG. 5 is a perspective assembled view of a fourth embodiment of the heat transfer component reinforcement structure of the present invention.

Please now refer to FIG. 5, which is a perspective assembled view of a fourth embodiment of the heat transfer component reinforcement structure of the present invention. The fourth embodiment is partially identical to the first embodiment in structure and thus will not be redundantly described hereinafter. The fourth embodiment is different from the first embodiment in that the reinforcement members 2 has a reinforcement main body 22, a first bent edge 23 and a second bent edge 24. The first and second bent edges 23, 24 extend from two sides of the reinforcement main body 22 and are normal to the reinforcement main body 22. By means of the first and second bent edges 23, 24, the reinforcement main body 22 are respectively attached to the first and second sides 13, 14 of the main body 1 and engaged (latched) with the main body 1.

Figure 6:
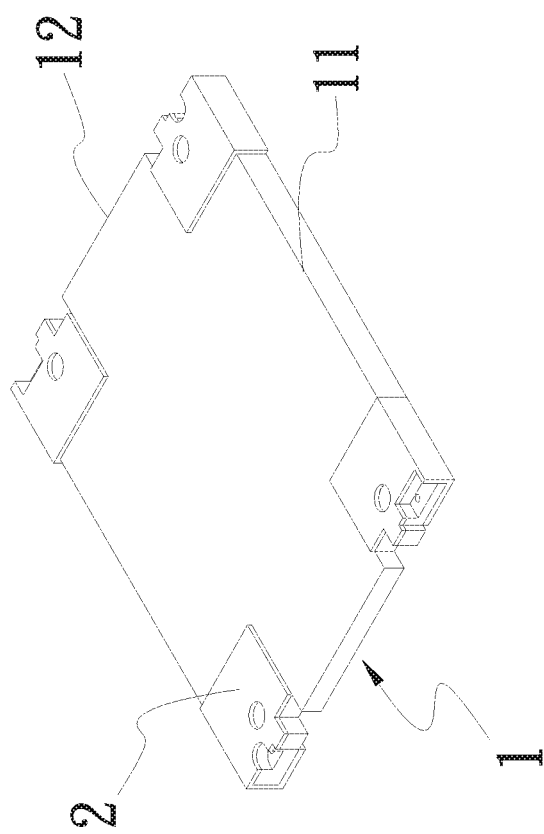
FIG. 6 is a perspective assembled view of a fifth embodiment of the heat transfer component reinforcement structure of the present invention.

Please now refer to FIG. 6, which is a perspective assembled view of a fifth embodiment of the heat transfer component reinforcement structure of the present invention. The fifth embodiment is partially identical to the fourth embodiment in structure and thus will not be redundantly described hereinafter. The fifth embodiment is different from the fourth embodiment in that the reinforcement members 2 are disposed at the junctions between the first and second lateral sides 11, 12 of the main body 1 in four corners or extend from the four corners and intersect each other.

The heat transfer component can be a heat conduction member, a heat conduction base seat or a heat sink. When the heat transfer component is secured to bear a resistance of pressure or bending force, the heat transfer component reinforcement structure of the present invention is arranged to greatly enhance the structural strength of the heat conduction member, heat conduction base seat and heat sink.

The present invention has been described with the above embodiments thereof and it is understood that many changes and modifications in such as the form or layout pattern or practicing step of the above embodiments can be carried out without departing from the scope and the spirit of the invention that is intended to be limited only by the appended claims.

What is claimed is:

1. A heat transfer component reinforcement structure comprising a main body and a plurality of reinforcement members, the main body being a heat conduction base seat and having a first side and a second side respectively positioned on upper and lower sides of the main body, a pair of first lateral sides, and a pair of second lateral sides, the reinforcement members being correspondingly externally connected with the main body, the reinforcement members being disposed along a longitudinal direction of the main body and engaged, latched and connected with the first lateral sides, wherein each of the plurality of reinforcement members has a reinforcement main body with a horizontal portion and a vertical portion extending perpendicular to the horizontal portion such that the horizontal portion and the vertical portion together form a L-shape configuration, the reinforcement main body extending from one of the second lateral sides to an opposing one of the second lateral sides, the horizontal portion being generally planar and selectively attached to and partly overlapping the first side or the second side of the main body, the vertical portion abutting and covering one of the pair of first lateral sides, the reinforcement main body of each reinforcement member having a pair of opposing ends and a hook section disposed at each of the opposing ends normal to the reinforcement main body horizontal portion, the main body having an engagement split corresponding to each hook section in communication with the first and second sides of the main body, each hook section being inserted and engaged in the corresponding engagement split of the main body, thereby increasing strength of the main body and able to bear greater downward or upward pressure or tension without deforming or damaging.

2. The heat transfer component reinforcement structure as claimed in claim 1, wherein the main body and the reinforcement member are made of the same material or different materials.

\* \* \* \* \*